(12) United States Patent
Kumar et al.

(10) Patent No.: US 6,813,259 B1
(45) Date of Patent: Nov. 2, 2004

(54) METHOD AND APPARATUS FOR MINIMIZING DELAY VARIANCE VIA TIME DIVIDED TRANSMISSIONS

(75) Inventors: Sampath Kumar, Germantown, MD (US); Anil K. Agarwal, Gaithersburg, MD (US)

(73) Assignee: Viasat, Inc., Carlsbad, CA (US)

( * ) Notice: Subject to any disclaimer, the term of this patent is extended or adjusted under 35 U.S.C. 154(b) by 0 days.

(21) Appl. No.: 09/462,897

(22) PCT Filed: Jul. 15, 1998

(86) PCT No.: PCT/US98/14199

§ 371 (c)(1),
(2), (4) Date: Apr. 25, 2000

(87) PCT Pub. No.: WO99/04509

PCT Pub. Date: Jan. 28, 1999

Related U.S. Application Data

(60) Provisional application No. 60/052,539, filed on Jul. 15, 1997.

(51) Int. Cl.[7] .......................... H04J 3/26; H04L 12/56; H04L 12/66
(52) U.S. Cl. ....................... 370/338; 370/347; 370/349; 370/395.6; 370/466; 370/474; 370/477
(58) Field of Search ................................ 370/316, 321, 370/337, 338, 347, 349, 389, 395.1, 395.5, 395.53, 395.6, 401, 465, 466, 467, 474, 477

(56) References Cited

U.S. PATENT DOCUMENTS

| | | |
|---|---|---|
| 5,282,207 A | 1/1994 | Jurkevich et al. |
| 5,313,454 A | 5/1994 | Bustini et al. |
| 5,412,655 A | 5/1995 | Yamada et al. |
| 5,475,681 A * | 12/1995 | White et al. ................. 370/349 |
| 5,517,505 A * | 5/1996 | Buchholz et al. ........... 370/350 |
| 5,557,621 A | 9/1996 | Nakano et al. |
| 5,570,362 A | 10/1996 | Nishimura |
| 5,638,371 A | 6/1997 | Raychaudhuri et al. |
| 5,640,395 A | 6/1997 | Hamalainen et al. |
| 5,808,722 A * | 9/1998 | Suzuki ......................... 352/12 |

OTHER PUBLICATIONS

IEEE Communications Magazine; "Satellite ATM Networks: A Survey"; Jul. 1997; pp. 30–43.
IEEE Communications Magazine; "QoS Guarantees For Multimedia Services On A TDMA–Based Satellite Network"; Jul. 1997; pp. 56–65.

\* cited by examiner

*Primary Examiner*—Alpus H. Hsu
(74) *Attorney, Agent, or Firm*—Sughrue Mion, PLLC

(57) ABSTRACT

A method and apparatus for providing a low 2-point Cell delay variation (CDV) for cell or packet transmissions via a TDMA or TDM network, where the cells or packets are assembled in bursts or slots for transmission. In order to permit a TDMA or TDM network that carries cells or packets between source and destination pairs to guarantee that a desired 2-point CDV will be met, for example a 3 ms CDV required for Class 1 traffic, each cell is associated with a transmitted TDMA or TDM frame. Using a time counter and a frame counter in a transmitter interface, the cell or packet has appended to it a time count and a frame count that is sent across the network and made available to the receiving TDMA/TDM terminal. The receiving terminal uses this timing information to perform traffic shaping of the cell or packet stream, thereby reducing the impact of the 2-point CDV as well as the effect of cell clumping prior to distribution on a terrestrial network.

32 Claims, 8 Drawing Sheets

METHOD AND APPARATUS FOR MINIMIZING DELAY VARIANCE VIA TIME DIVIDED TRANSMISSIONS

The present application is based on U.S. provisional application Ser. No. 60-052,539 filed on Jul. 15, 1997 and priority therefrom is claimed under 35 U.S.C. §120. The entire content of Provisional Application Ser. No. 60-052,359 is incorporated herein by reference.

FIELD OF THE INVENTION

The present invention relates to the efficient and reliable transmission of packet or cell-based information, such as frame relay, SS#7, ISDN, Internet or asynchronous transfer mode (ATM) based information, via wireless links. More specifically, the present invention relates to a method and apparatus for minimization of cell or packet delay variance in satellite or wireless terrestrial networks that convey the traffic via Time Division Multiple Access (TDMA) or Time Division Multiplexing (TDM) techniques. While the present invention is applicable all of the foregoing types of transmission formats, the ATM format will be the exemplary focus of one preferred embodiment for purposes of providing an enabling disclosure, written description and best mode for the present invention.

BACKGROUND OF THE INVENTION

There are a variety of methods for transmitting information via a broadband Integrated Services Digital Network (B-ISDN), using a variety of protocols related to Asynchronous Transport Mode (ATM), frame relay mode, Internet, ISDN and SS#7 modes of transmission. The ATM mode, as the exemplary preferred embodiment, was originally investigated by a group called the International Telephone and Telegraph Consultative Committee (CCITT). The group, currently called the International Telecommunication Union-Telecommunications Standards Sector (ITU-TSS), investigated a new form of ISDN that would have the flexibility to accommodate a large number of channels and the ability to transfer large amounts of data at a very fast rate. At the end of the study, the Committee decided to adopt ATM as the target transfer mode for the B-ISDN. The ITU-TSS is currently defining the wide area network (WAN) standards for ATM.

ATM is a transfer mode that sends 53 octet-sized packets of information across a network from one communication device to another. The 53 octets are assembled as a "cell", which comprises 48 octets of data information, referred to as the "payload", and 5 octets of "header" information (including the routing information). The header and data information must be organized into cells so that when the cells are filled, they can be sent when an open slot of 53 octets becomes available.

There are two forms of headers that are specified in the CCITT Recommendation I.361. Each form is 5 octets long. There also are two different ATM network connections, each one having a different type of header. One connection form is the user-network interface (UNI), which is used between the user installation and the first ATM exchange and also within the user's own network. The other form of connection is the network-node interface (NNI) which is used between the ATM exchanges in the trunk network. The header format for the UNI consists of the following fields:

Generic flow control (GFC) field of 4 bits. It can provide flow control information towards the network from an ATM endpoint.

Routing field of 24 bits. Eight of the bits are VPI (virtual path identifiers) and 16 bits are VCI (virtual channel identifier). Empty cells with both the VCI and VPI set to zero indicates that the cell is unassigned.

Payload type (PT) field of 3 bits. This field is used to provide information on whether the cell payload contains user information or network information. This field is used by the network to intercept any important network information.

Cell loss priority (CLP) field containing 1 bit. This field may be set by the user or service provider to indicate lower priority cells. If the bit is set to 1 the cell is at a risk of being discarded by the network during busy times.

Header error control (HEC) field of 8 bits. This field is processed by the physical layer to detect errors in the header. The code used for this field is capable of either single-bit error-correction or multiple-bit error-detection.

As seen in FIGS. 1A and 1B, the header format for the NNI is the same as the header information of the UNI except that there is no GFC, and the VPI of the routing field is 12 bits instead of 8 bits.

Error detection occurs only within the header message. No error detection of the data occurs within the information portion of the cell. The receiving endpoint determines whether the data can be corrected or whether it must be discarded. When a link or node becomes busy, an ATM network must discard cells until the problem is resolved. The first cells to be discarded are the cells that have a CLP bit in the header set to a "1". Since connection endpoints are not notified when a cell is discarded, higher layers of protocols are needed to detect and recover from errors.

A cell is sent along a channel called a Virtual Channel (VC) or Virtual Channel Connection (VCC). A VCC consists of a series of links that establish a unidirectional connection through the network that allows the flow of information from one endpoint to another endpoint. Cells on a VCC always follow the same path through the network. Therefore, each cell arrives at its destination in the same order in which it was transmitted. VCCs can be unidirectional or may occur in pairs, thus making the connection bi-directional. VCCs can be within a path called a Virtual Path (VP) or Virtual Path Connection (VPC), meaning a group of virtual channels that are associated together, so as to be sent as a large trunk for a part of network. The VCCs are multiplexed and demultiplexed at appropriate network nodes in the network. Each VCC and VPC have specially assigned numbers called Virtual Channel Identifiers (VCI) and Virtual Path Identifiers (VPI), respectively. These numbers help the system determine the direction in which the cells belonging to the connection should be sent and which applications should be associated with the connection.

Although ATM-based transmission, switching, and network technology has been employed in broadband integrated services digital networks (B-ISDN) which rely on fiber optics, there are numerous difficulties associated with implementing ATM based technology in a wireless communication network. These difficulties include the fact that ATM-based networks and switches rely on a number of high speed interfaces. These high-speed standard interfaces include OC-3 (155 Mbit/s), OC-12 (622 Mbit/s) and DS3 (45 Mbit/s). However, a few ATM based networks and switches support lower speed interfaces, such as T1 (1.544 Mbit/s) and the programmable rate RS-449 interface.

As a consequence, there are only a few interfaces which can support the comparatively low transmission rates (less than 1 Mbit/s to a 8 Mbit/s) used in wireless communication. Although commercial satellite and wireless modems support these low transmission rates using an RS-449 programmable rate interface, it is difficult to implement ATM based technology in a wireless environment using conventional interfaces because most ATM traffic is transmitted over high rate data interfaces.

Another difficulty associated with implementing ATM based technology in a wireless communication network has to do with the fact that ATM based protocols rely on extremely low bit error ratios which are typical of fiber optics based networks. By way of example, ATM protocols assume that the transmission medium has very low Bit Error Ratios (BER) ($10^{-12}$) and that bit errors occur randomly.

In contrast, the bit error ratios associated with wireless communication are much higher (on the order of $10^{-3}$ to $10^{-8}$) and tend to fluctuate in accordance with atmospheric conditions. In addition, the errors associated with wireless communication tend to occur in longer bursts. Thus, a robust error correction scheme must be employed in a wireless network in which ATM-based technology is to be implemented.

A further constraint is that the cost of bandwidth in a wireless network is much higher than for fiber optics networks. As a consequence of having been traditionally implemented in fiber optics networks, ATM based technology is not particularly efficient in its use of transmission bandwidth. Therefore, if ATM-based technology is to be implemented in wireless networks, it must achieve a more efficient use of bandwidth.

In addition to the difficulties discussed above, there is another significant constraint placed on wireless communication networks. This constraint has to do with the transmission of ATM cells using a time divided transmission technique, such as TDMA and TDM, so that a limited system resource (bandwidth) can be shared by a large number of users. For example, during the establishment of a VCC in an ATM network, a traffic contract is negotiated between the source and the network. This traffic contract specifies the expected behavior of the source and the network. The behavior of the source is specified in terms of a traffic descriptor that describes the traffic that will be generated by the source. The traffic descriptor describes the traffic in terms of the Peak Cell Rate (PCR), Sustained Cell Rate (SCR), Maximum Burst Size (MBS) etc., which ever is applicable, as defined in the Traffic Management 4.0, ATM Forum Specification. The behavior of the network is specified in terms of the Quality of Service (QOS) that it will guarantee to the traffic belonging to the VCC. The QOS is specified in terms of the Cell Transfer Delay (CTD), Cell Delay Variation (CDV), Cell Loss Ratio (CLR), Cell Error Ratio (CER), Cell Misinsertion Rate (CMR) and Severely Errored Cell Block Ratio (SECBR). Of these, the former 3 are negotiated during the establishment of the traffic contract and the latter three take default values as defined in the ITU-TSS Recommendation I.356 BISDN ATM Layer Cell Transfer Performance.

The 2-point CDV is an important performance parameter for any ATM network. FIGS. 2A and 2B show how the 2-pt CDV is defined. With reference to FIG. 2A, the delay that cells going from node A and node B experience are plotted and the difference between the delay that more than α percent of the cells undergo and the minimum cell transfer delay is referred to as the "peak-to-peak 2-point CDV", as seen in FIG. 2B. The ITU-TSS Recommendation I.356 BISDN ATM Layer Cell Transfer Performance specifies that Class 1 or Constant Bit Rate (CBR) VCCs should experience a 2-point CDV of no more than 3 ms. Applications such as Circuit Emulation, Voice and Video would require such stringent 2-pt CDV performance from the network. User applications and devices are designed with this specification as the basis. So it is imperative that the ATM network guarantee the 3 ms CDV to be able to carry Class 1 or CBR traffic efficiently.

By way of example, without loss of generality, consider an ATM switch with 16 DS3 ports and analyze the CDV problem using 4 scenarios. ATM switches typically do most of the cell switching and other cell related functions in hardware and there would be negligible variation in the processing times. The CDV would be introduced because of differences in link speeds and framing structure in the ingress and egress links, queuing and scheduling.

Scenario 1: If there is only one VCC going from port 1 to port 2 in the ATM switch and there are no other VCCs, the CDV that cells will experience in the switch is 1 cell slot time of the egress link. A cell might arrive on the ingress link, just after a cell slot has begun on the egress link and hence the cell will have to wait a whole cell slot time of the egress link and then be transferred on the following cell slot. Since the egress link is a DS3 link, a cell slot time is about 9.4 microseconds (us).

Scenario 2: Consider 2 VCCs in the switch : one going from port 1 to port 3 and another going from port 2 to port 3. Consider the case, when cells from the VCCs on port 1 and port 2 arrive simultaneously, just after a cell slot has started on port 3. Consider also that the cell from the VCC on port 1 is scheduled to be transmitted before the cell from the VCC on port 2. In this case, the CDV experience by the cell from the VCC on port 2 is 2 cell slot times on the egress link. Since the egress link is a DS3 link, the CDV experienced by the cell is 18.8 (us).

Scenario 3: Consider 15 VCCs in the switch: VCC 1 goes from port 1 to port 16, VCC 2 from port 2 to port 16 and so on, and finally, VCC 15 goes from port 15 to port 16. Consider the event where cells from the VCCs on ports 1 through 15 arrive simultaneously to be transmitted on port 16. Assume, also that the cell from port 1 is transmitted first, the cell from port 2 is transmitted next and finally the cell from port 15 is transmitted on the link. In this case, the CDV experienced by the cell from the VCC on port 15 is 15 cell slot times on the egress link. On a DS3 egress link, this would be about 142 us.

Scenario 4: Consider a VCC being transmitted through 20 ATM switches all of which are 16 port ATM switches. Assume also, for simplicity, that all links in the network are DS3 links. Considering the worst case in each ATM switch, a cell would experience a cumulative CDV of 9.4 * 15 * 20 us which is 2.8 milliseconds (ms). This is within the 2-pt CDV values specified in ITU-TSS Recommendation I.356 BISDN ATM Layer Cell Transfer Performance.

It must be noted that on terrestrial networks, the full port bandwidth is at the disposal of the ATM switch, in contrast to the more limited amount of bandwidth that is available when the bandwidth resource is being shared by multiple terminals in a satellite or wireless network. The only reasons for any CDV in an ATM switch would be queuing, scheduling, differences in link speeds and framing structures and to a much lesser extent, processing delay. There is a further basis for CDV when ATM transmissions occur in a satellite or wireless system using TDMA.

Consider the flow of ATM cells and the framing structure in a TDMA network as shown in FIG. 3A–3C. In FIG. 3B, Terminal 1 has a terrestrial DS3 interface on which is transmits and receives ATM cells. It communicates via satellite 3 with Terminal 2 over a TDMA network. With reference to FIG. 3A, the TDMA frame period is typically designed to be between 16 to 48 ms, for efficiency purposes. The frames contain bursts that could either be signaling, control or traffic bursts. Traffic bursts are allocated for communication from one terminal to another. Information about this allocation is known to both the transmitting and receiving terminals. During the frame, the transmitting terminal waits for its burst and then transmits the information it has for the destination terminal. The destination terminal receives the burst and then transmits the received information on the terrestrial link.

Apart from the factors that affect 2-pt CDV in terrestrial networks, there are 2 other framing related factors that affect the CDV performance of a TDMA based ATM network. First, there are pre-allocated bursts in the TDMA frame for communication from one terminal to another. This introduces a 2-pt CDV of up to one TDMA frame period, which can be from 16–48 ms, as mentioned above. Second, traffic bursts in the TDMA frame could have bandwidth For several ATM cells. As an example, let us consider a traffic burst for 256 ATM cells. These 256 cells might arrive at the transmitting TDMA terminal from the terrestrial network in a well-spaced manner. These cells will be queued for transmission on the next available traffic burst. The cells arrive at the receiving TDMA terminal, which would then transmit these cells to the terrestrial network. Without any timing information, these cells would be transmitted back to back thus seriously deteriorating the 2-pt CDV performance of the TDMA network as shown in FIG. 3C.

The same factors as described above would affect a TDM-based network that also transmitted ATM cells. Pre-assigned slots for transmission to a particular terminal will introduce 2-pt CDV of up to a TDM frame period. Also, cells arrive at the receiving TDM terminal in a clumped manner, deteriorating the CDV performance of the TDM network further.

There are no known solutions which address the minimization of 2-point Cell Delay Variation of packet-type transmissions, such as ATM cells, frame relay packets or the like, over satellite and wireless networks. Moreover, the extension of this problem to other primary access interface systems would be clear to one of ordinary skill in the art.

For example, other primary access interfaces that would experience the foregoing problems include ISDN/SS#7 (for switched digital circuits, voice, fax and video conferencing) and packet-based system such as Internet and "frame relay" (for LAN interconnection and Internet access) using TCP/IP or other LAN protocols. Considerations similar to those for ATM are relevant to the transmission of traffic using these other interfaces, as exemplified by the transmission of frame/relay traffic over satellite/wireless networks, although some differences are known in the art.

For example, unlike ATM cells, frame relay packets are variable lengths. Thus, the frame formats used to communicate between the satellite/wireless terminals are arranged to transport variable length packets efficiently.

As explained in the Provisional Application Ser. No. 60-052,359, which is incorporated herein by reference, the frame/relay uses a robust, flexible frame format between two communicating terminals. This allows the transport of several variable sized Spackets (segmented packets) in a frame and also allows a single Spacket to be carried over several frames, whichever the case might be. Also, the frame format allows fast synchronization and the exchange of coding information. Each frame contains Reed-Solomon (RS) check bytes that are used for error correction and to enhance the quality of the satellite/wireless link. The number of RS check bytes in a frame can be changed on the fly, without any loss of data, to compensate for varying link conditions. The decision to change the RS check bytes in a frame is based on the constant monitoring of the link quality. Several frames are also interleaved before transmission over the satellite/wireless link, to help spread the effect of burst errors over several frames, all of which can then be corrected by the FEC in the frames.

Also, Virtual Channels (VCs) can be configured to be enabled for data compression, which means that the Spackets belonging to the VC are passed through a data compressor/decompressor combination to save bandwidth. VCs can also be configured to be either high or low priority VCs and the scheduler then, uses this information to fairly transmit the various Spackets over the satellite/wireless link. To minimize the large delays introduced by the transmission of low priority packets on a low bit rate link, and the delay experienced by high priority packets which are waiting to be scheduled, the Spacket allows the segmentation of large packets into several, smaller Spackets. The delays experienced by high priority packets are substantially reduced. This also allows for efficient implementation of the compression and decompression modules.

The frame relay arrangement using Spackets also faces the problem of efficiently using bandwidth in a wireless network. Therefore, if frame relay (Spacket)-based technology is to be implemented in wireless networks, it must achieve a more efficient use of bandwidth. These same goals apply to ISDN and SS#7 (ISDN/SS#7) transmissions, Internet transmissions and those generally using TCP/IP protocols. However, no solution to problems blocking achievement of these goals is seen in the prior art.

Accordingly, it is an object of the present invention to address and solve these problems.

SUMMARY OF THE INVENTION

The present invention overcomes the above-mentioned problems associated with implementing packet-type or cell-type transmissions in a wireless communication network that transmits via TDMA or TDM by providing a frame format for a communication signal containing a bit stream including packet formatted data.

The present invention overcomes the above-mentioned problems, particularly for ATM-type or frame relay-type transmissions, in a wireless communication network that transmits via TDMA or TDM by providing a frame format for a communication signal containing a bit stream including asynchronous transfer mode (ATM), ISDN/SS#7, Internet or frame relay-formatted data.

The invention concerns a portion of the time division (TDMA or TDM) system interface, which is located between an ATM switch and the WAN transmission device. The time division interface design is based upon an architecture and frame structure that encompasses TDM or TDMA frame assemble/disassemble functions.

Further, the present invention provides a time division frame structure and content that appends time and frame stamp information to each packet or cell, such that the original timing and position of each packet or cell relative to other packets and cells can be uniquely identified.

The present invention also provides an algorithm for appending a time and frame stamp to desired packet or cell transmissions that is simple and streamlined and can be implemented efficiently in software and simple hardware.

As used herein, the term "cell" shall be used to mean a fixed size container, such as the ATM cell, and the term "packet" shall be used to mean and a variable size container, and the term "cell/packet" shall mean generically either or both such container arrangements.

BRIEF DESCRIPTION OF THE DRAWINGS

These and other features, aspects and advantages of the present invention will become better understood with reference to the following description, appended claims, and accompanying drawings, in which:

DETAILED DESCRIPTION OF THE PREFERRED EMBODIMENTS

While the subject matter of the present invention is generally applicable to cell and/or packet-based transmission formats in TDMA and TDM transmission systems, it is best illustrated with respect to its preferred application to communications within an ATM-based or frame relay network that includes links via wireless or satellite using TDMA transmissions. In a first preferred embodiment, the invention is based on an interface that uniquely identifies ATM cells or packets for transmission of ATM-based traffic in a wireless communication network using TDMA. The interface may also facilitate the transmission of ATM-based traffic over a TDM-based network.

The present invention specifically concerns a novel scheme, incorporated in the interface of a terminal that connects to a wireless terrestrial or satellite system that uses the point to multi-point capabilities of TDMA or TDM techniques for multiple access by transmitting/receiving stations to a shared communication medium.

Figure 4B:
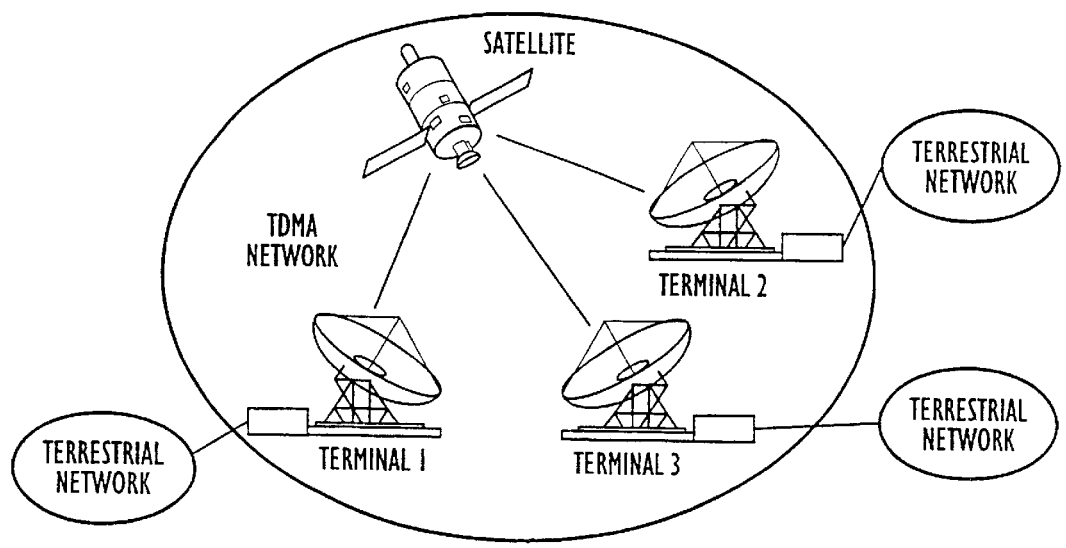
FIGS. 4A and 4B show an overall illustration of a satellite network for packet or cell communication via TDMA.
Figure 2A:
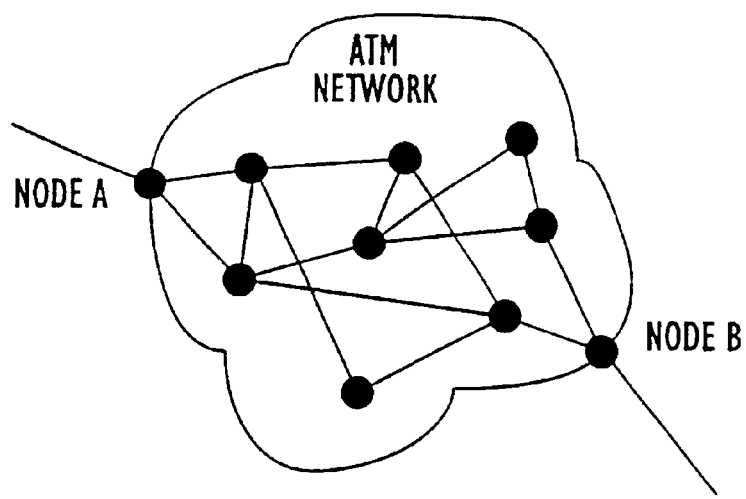
FIG. 2A shows a wireless/satellite system architecture, with an interface at each of a receiving and transmitting station, which implements the present invention.
Figure 2B:
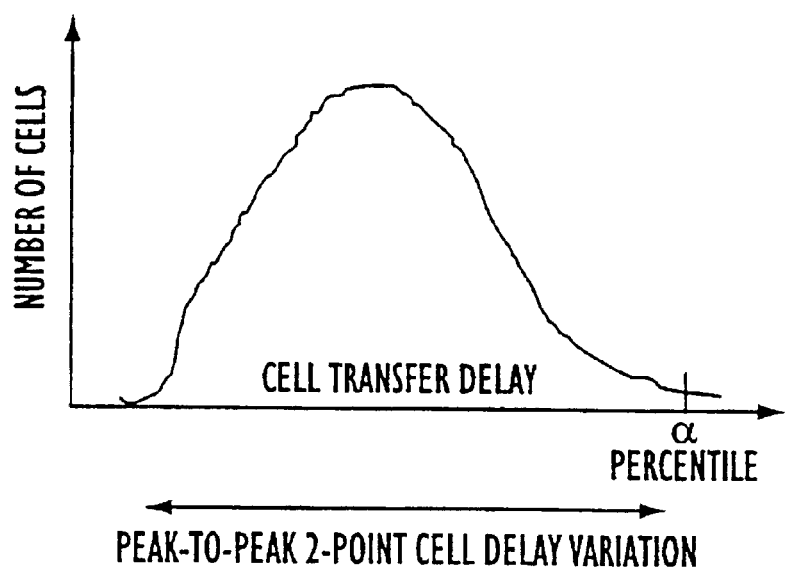
FIG. 2B shows plot of cell transfer delay.
Figure 4A:
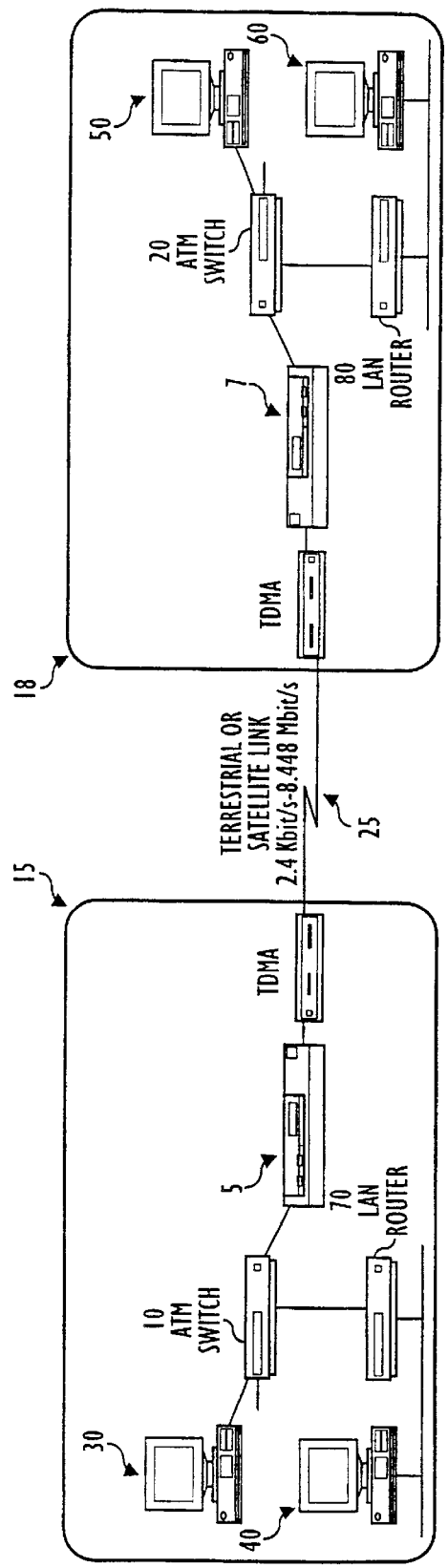

FIG. 4A depicts a communication system involving two local area networks (LAN) 15 and 18 that are connected by a terrestrial wireless or satellite link 25 that, in a preferred embodiment but without limitation thereto, can operate in the range of 2.4 Kb/s to 8.448 Mb/s. Each network has a respective TDMA/ATM interface 5, 7 that provides a means of interconnecting a standard ATM switch 10 and 20 in each LAN over the point-to-multi-point wireless or satellite link 25 within a multi-terminal system as shown in FIG. 4B. The TDMA/ATM interfaces are detailed in FIG. 7 and are operative to provide high quality service for ATM-based applications and to provide an efficient use of transmission link bandwidth. In the illustrated application, the ATM switches 10 and 20 are connected to respective groups of computers (e.g., 30, 40 and 50, 60) directly or through LAN routers 70 and 80. The interfaces 5, 7 include TDMA equipment, including modems, to connect several other terrestrial networks via individual terminals together via wireless or satellite link 25 in a point to multi-point or mesh network.

Figure 1A:
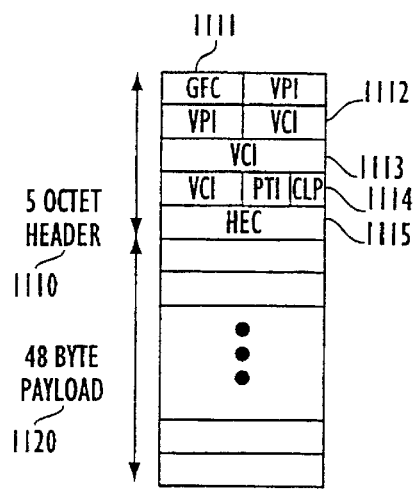
FIGS. 1A and 1B show an ATM cell structure having the UNI and NNI header formats, respectively.
Figure 1B:
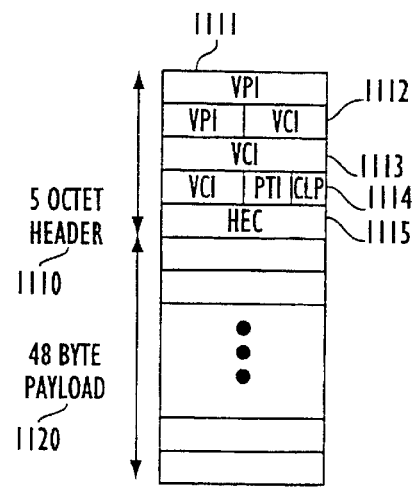

The standard ATM cell and frame formats that are relevant to the implementation of the present invention are illustrated in FIGS. 1A and 1B, respectively. With respect to the standard ATM cell format as seen in FIG. 1A, the cell 1100 includes a header 1110, comprising five octets 1111–1115, and a payload 1120 comprising 48 octets. The five octets in the header include an HEC checksum, two virtual path identifiers (VPID) and two virtual circuit identifiers (VCID).

The problem that this invention tries to address is the deterioration of the 2-point CDV performance of ATM (frame relay, ISDN or similar cell/packet-based) traffic in satellite/wireless networks which use a TDMA or TDM frame structure. This invention is not restricted to CBR or Class 1 type of ATM traffic. This method could be used to minimize the 2-point CDV of any class of ATM (or other cell/packet-based) traffic that the designer thinks necessary. Traffic for which this 2-point CDV minimization technique has been implemented is referred to as Type-1 traffic. The traffic for which this technique has not been implemented may be called Type-2 traffic.

The two basic problems being addressed in this invention are the following:
  bursts/slots in TDMA/TDM frames between source/destination pairs introduce a 2-point CDV of up to a frame period
  packets or cells transmitted in a burst/slot are received in a clump and are transmitted back-to-back on the terrestrial network.

This invention provides a system in which cells or packets are associated with timing information relative to the TDMA/TDM frames and this information is transmitted across the network and made available to the receiving TDMA/TDM terminal. The receiving terminal uses this timing information to perform Traffic Shaping of the ATM cell or packet stream, as defined in the Traffic Management 4.0, ATM Forum Specification, and thus reduces the impact of the two problems that are related to the 2-point CDV.

Figure 3A:
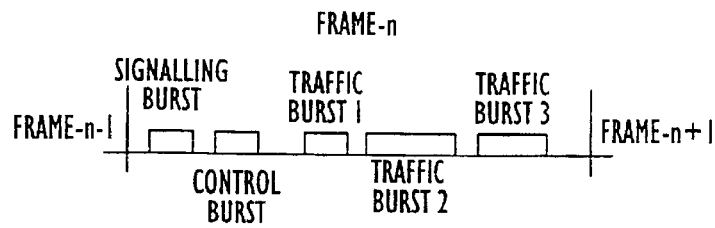
FIG. 3A shows a conventional TDMA frame format applicable to the present invention.
Figure 3B:
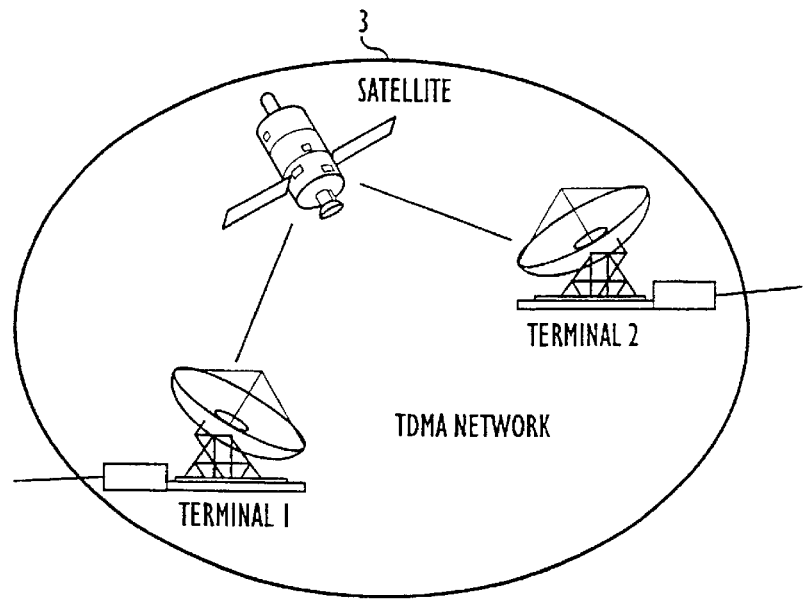
FIG. 3B shows a 2-terminal TDMA satellite network that presents the problems solved by the present invention.
Figure 3C:
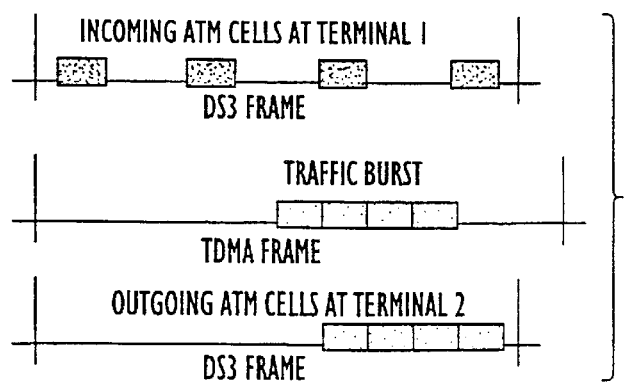
FIG. 3C shows an example of a frame formed for transmission of ATM cells and packets in accordance with the present invention.
Figure 5:
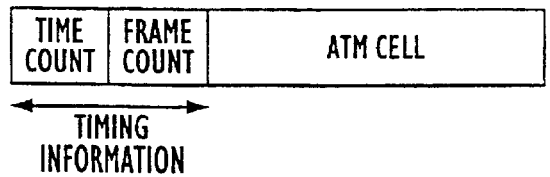
FIG. 5 shows an example of an ATM cell coupled with the timing information related to time count and frame count, as formed in accordance with the present invention.
Figure 7:
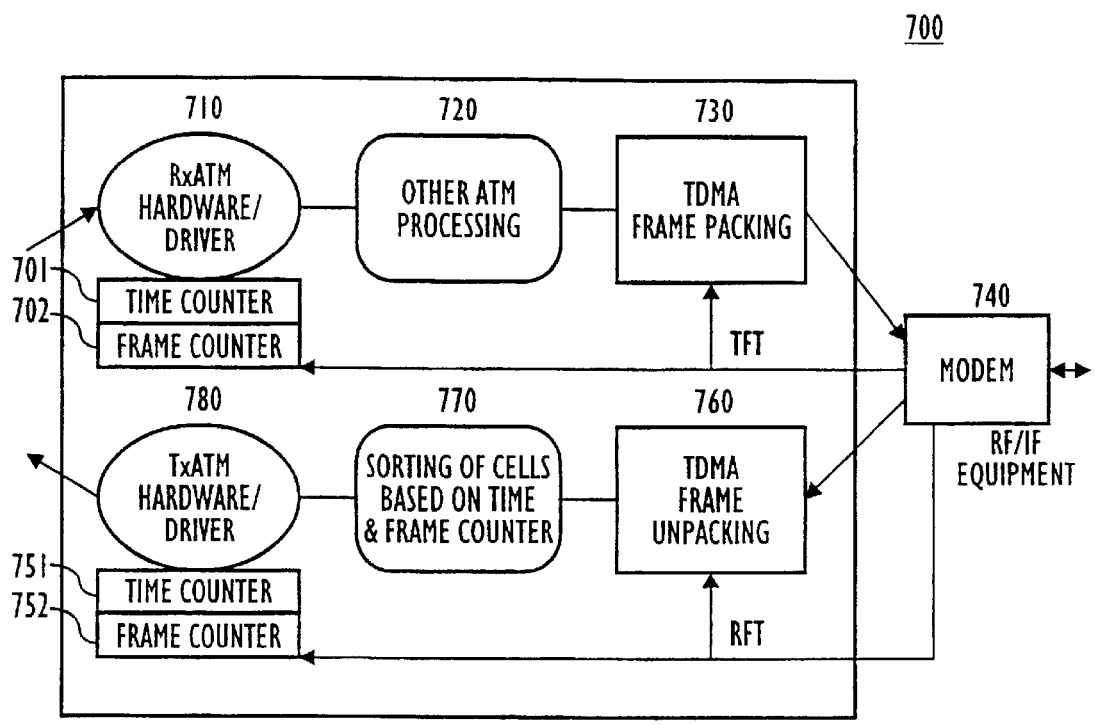
FIG. 7 is a schematic illustration of the interface at each TDMA station handling packets or cells, in accordance with the present invention.

Let us consider a two-terminal TDMA network as seen in FIG. 3B with a TDMA frame period of x ms. Consider ATM traffic going from Terminal 1 to Terminal 2. The timing information is carried as a Timestamp and a Frame Count with each cell as shown in FIG. 5. In each of terminals 1 and 2 there is a TDMA/ATM interface 700 between a modem 740 for connection to Rf/If equipment common to a satellite transmission terminal, as seen in FIG. 7. In a transmitting portion of each terminal (e.g., Terminal 1), there is a time counter 701 which is reset at every Transmit Frame Time (TFT) and a frame counter 702 which is incremented by 1 every TFT. The time counter 701 is a n bit counter and goes from 0 to 2n −1 in each frame period. The time counter 701 hence has a granularity of x/2n ms. Each ATM cell is associated with the value of the time counter 701 and the frame counter 702 when it is received from the terrestrial ATM network. This timing information is sent along with the ATM cell across the network to the receiving TDMA terminal. At the receiving terminal, a similar time counter 751 is maintained which is reset at every Receive Frame Time (RFT). Also, a frame counter 752, which increments by 1 every RFT, is maintained. Each ATM cell that has been received from terminal 1, will be sent only when the value of the counter is equal to or greater than the timestamp value of the ATM cell and the frame counts of the ATM cell and the receiving terminal match.

Figure 6A:
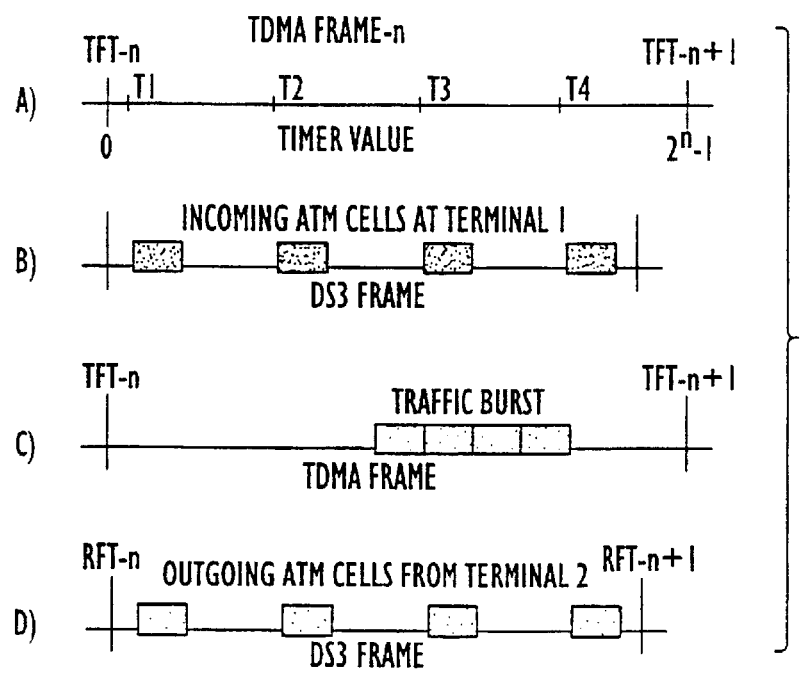
FIG. 6A illustrates the timing of cells or packets being transmitted across a TDMA network.
Figure 6C:
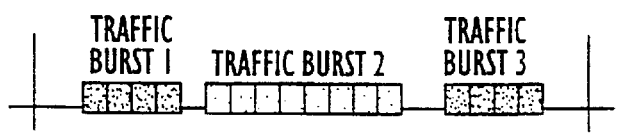
FIG. 6C illustrates traffic bursts from multiple transmitting terminals arriving at a single receiving terminal.
Figure 6B:
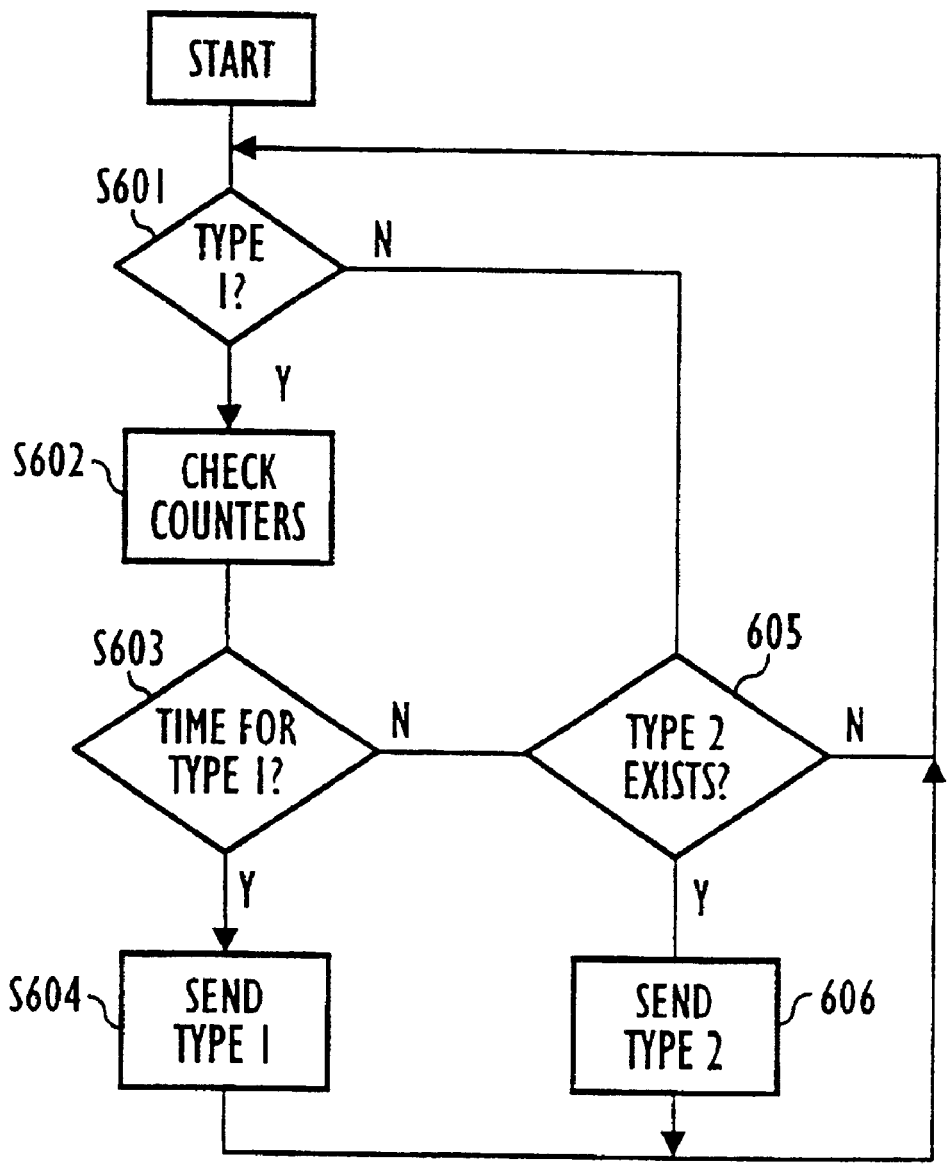
FIG. 6B shows a flow chart or algorithm used to transmit Type-1 and Type 2 traffic.

FIG. 6A illustrates the use of the timing information to minimize the CDV of the ATM cell stream being transmitted by terminal 2 to the terrestrial network. A simple algorithm is used to transmit Type-1 and Type-2 traffic, as illustrated in FIG. 6B.

In step 601, check if a Type-1 Cell exists. If a Type-1 cell exists, in step 602, check the time counter and frame counter In step 603, check if time to send Type-1 cell. If time to send, then in step 604 transmit Type-1 cell. Otherwise, check if a Type-2 cell exists in step 605. If a Type-2 cell exists, then in step 606 transmit the Type-2 cell. If the Type-2 cell does not exist, then return to step 601.

In this case, a maximum 2-pt CDV of 1 cell slot time of the egress link plus the granularity of the counter is introduced because of this implementation.

In case of multiple terminals in the TDMA/TDM network, bursts might arrive from different transmitting terminals to a receiving terminal. All the ATM cells would have timing information associated with them, but the cells would arrive out of sequence as shown in FIG. 6C. The figure shows bursts from multiple terminals arriving at a receiving terminal. The cells in all the bursts need to be sorted by their timestamps and frame count values and then the timing information should be used to transmit the cells on the terrestrial network.

With the present invention, a full-mesh, variable rate, Bandwidth-on-Demand, turnkey Satellite Network ideal for service providers and private businesses that require point-to-point and point-to-multipoint connections among geographically dispersed sites can be achieved. FIG. 4 shows a high level description of the system. The network also provides a variety of terrestrial interfaces such as T1, E1, DS3, E3, synchronous serial, asynchronous serial etc. These interfaces carry various types of cell/packet traffic such as Frame Relay Frames, ATM cells and IP Packets. This invention address the implementation of the CDV minimization method in a particular satellite network, but it is applicable to all satellite and wireless networks.

FIG. 7 shows a high level implementation of the TDMA/ATM interface 700 between the ATM network and the satellite transmission system. As already explained, a modem receives and sends Rf/If signals from the satellite system. On the transmit side, the ATM cells from the ATM network are received by the ATM hardware driver 710, which appends to each ATM cell the time count and frame count from the time counter 701 and frame counter 702. The modified ATM cells, having the form shown in FIG. 5, are then subject to conventional ATM processing in ATM interface 720, including data compression, priority management, traffic policing, VCI/VPI translation and other conventional ATM functions, and provided to the TDMA frame packing unit 730. It would be apparent to one or ordinary skill that a variety of synchronization procedures may be used to synchronize the frame counters in all the terminals in the TDMA network. As seen in the figure, the modem provides TFT signals to the TDMA frame packing unit 730 and to the frame counter 702 for synchronization purposes. On the satellite receive direction, cells from multiple bursts are received in TDMA frame unpacking unit 760 and then sorted in unit 770 on the basis of the time and frame counter values appended to the ATM cells that are received. Other conventional ATM functions such as data decompression also are included in the unit 770. On the basis of the timing information from all the cells, the cells can be properly ordered from the arrangement seen in FIGS. 6A(c) to that seen in FIG. 6A(d). On the basis of the rearrangement of the ATM cells, and following their conventional processing in unit 770, the cells will be driven onto the terrestrial ATM network with minimal 2-point Cell Delay Variation by ATM Hardware driver 780. The time counter 751 and frame counter 752 ensure that the local timing and the timing of the received ATM cells are in synchronization prior to transmission out onto the terrestrial ATM system. The modem provides the ATM modules with the TFT and the RFT signals that Provide a coordination function in the illustrated implementation of the invention. Similarly, the modem provides the RFT signal to the TDMA frame unpacking unit as well as the frame counter 752

In a preferred embodiment, the time counter 701/751 may use a 8 bit counter for the time counter and the frame period is 25 ms. Hence, the granularity of the time counter 701/751 is 25 ms/256, which is about 100 us. Also, if the egress link is a DS3 link with a cell slot time of 9.4 us, the maximum 2-point CDV introduced by this implementation is 9.4 us+100 us which is about 110 us. This is still within the specifications of ITU-TSS Recommendation I.356 BISDN ATM Layer Cell Transfer performance and is comparable to the worst case 2-point CDV performance of a 16 port ATM switch.

Figure 8A:
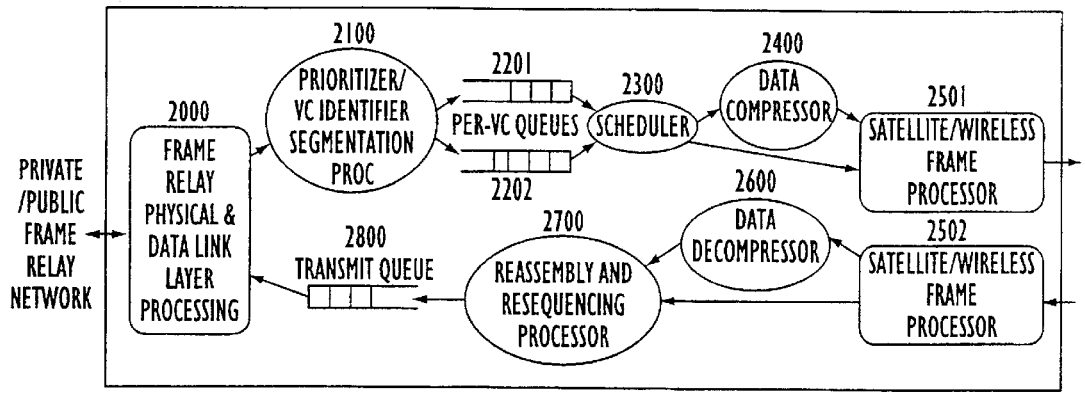
FIG. 8A illustrates a high level arrangement for a frame relay system.

FIG. 8A is a high level description of a frame relay system that performs frame relay processing to efficiently carry frame relay packets over wireless/satellite links. This system can perform the following:

Frame Relay processing at the Physical Layer and the Data Link Layer

Formatting of Data (variable length packets, segmentation and reassembly, resequencing)

Dynamic Forward Error Coding

Interleaving of frames (to spread the effect of burst errors)

Per-VC data compression

Prioritization and Scheduling

Header Compression

In the high level description of the various functions performed in the system seen in FIG. 8A, to the left of the diagram is the private/public frame relay network and to the right is the satellite/wireless link.

The illustrated system uses a robust, flexible frame format between the 2 communicating terminals which allows the transport of several variable sized Spackets (segmented packets) in a frame and also to carry a single Spacket over several frames, whichever the case might be. Also, the frame format allows fast synchronization and the exchange of coding information. Each frame contains Reed-Solomon check bytes that are used for error correction and to enhance the quality of the satellite/wireless link. The number of RS check bytes in a frame can be changed on the fly, without any loss of data, to compensate for varying link conditions. The decision to change the RS check bytes in a frame is based on the constant monitoring of the link quality. Several frames are also interleaved before transmission over the satellite/wireless link, to help spread the effect of burst errors over several frames, all of which can then be corrected by the FEC in the frames. Also, Virtual Channels (VCs) can be configured to be enabled for data compression, which means that the Spackets belonging to the VC are to be passed through a data compressor/decompressor combination to save bandwidth. VCs can also be configured to be either high or low priority VCs and the scheduler then, uses this information to fairly transmit the various Spackets over the satellite/wireless link.

In operation, a private or public frame relay network provides the frame relay packets to the frame relay physical and data link layer processing block 2000, where they are received and-processed as specified in ITU recommendation Q.922 (Link Access Procedures for Frame Relay). The physical layer processing is similar to the processing of any HDLC data stream. This is the processing performed in most Frame Relay Access Devices (FRADs).

A frame relay packet received from the terrestrial network consists of payload data and a CRC field, and flags at the beginning and the end of the frame. The frame relay processing removes the flags and the CRC fields and transports only the payload section of the frame relay packet over the satellite link. The CRC and the flag information is regenerated at the receiving terminal and added to the packet before it is transmitted to the receive side terrestrial network.

Figure 8B:
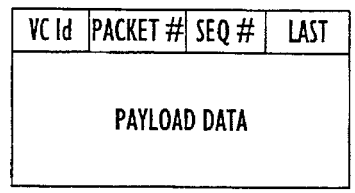
FIG. 8B illustrates the fields in a Spacket used in in a frame relay system.

In prioritizer/VC identifier/Segmentation processor 2100, the variable length frame relay packets are segmented into several smaller packets called Spackets. The Spackets allow efficient scheduling of packets belonging to multiple priorities and lossless data compression. FIG. 8B illustrates the various fields in a Spacket, whose content provides for efficient processing of the Spackets, as subsequently described.

In order to avoid an intolerable delay of high priority packets (e.g., audio and video) due to processing and transmission of low priority packets, Spackets belonging to a high priority packet could be transferred after a single Spacket from a low priority packet has been transferred, thus minimizing the delay variance that the high priority packet experiences. This technique minimizes the delay variance significantly and the satellite/wireless network performance is better than terrestrial networks, as far as delay variance is concerned. Thus, when each frame relay packet is segmented into one or more Spackets, all but the last Spacket are n bytes long. The last Spacket could also be n bytes long if the frame relay packet, to begin with, was of a length which was an integral multiple of n. A Spacket is then prepended with a header as shown in FIG. 8B that contains a Virtual Channel (VC) Identifier for the channel to which the packet belongs. Also, the header is supplied with the packet and the sequence numbers. The packet number increments for each new frame relay packet. The sequence number increments for each Spacket within the frame relay packet. Information about the priority of the packets and whether or not the packets are compressed is maintained locally. All this information is used to perform segmentation/reassembly, data compression/decompression, prioritization and scheduling. The "last field" indicates whether or not the Spacket is the last Spacket for the frame relay packet. If it is, then at the receiving terminal, the frame relay packet can be reassembled and transmitted over the terrestrial link.

The sizes of the various fields can be left to the discretion of the system designer. The VC Id field would either be the size of the entire VC field in the frame relay packet or could be the size specified in the header compression parameters. The size of the Packet number and Sequence number are also left to the system designer. The "last field" is a single bit. The size of the payload is determined by a trade-off between the overheads and the performance of the system. If the payload size is very low, the overheads will be very high, but the delay variance performance of the system will be very good. If the payload size is set to a large value, then the delay variance performance will be poorer but the overheads will be lower. Hence, the sizes would depend on the overheads the designer is prepared to allow, and the performance specifications of the system.

Next, queues of Spackets belonging to different VCs are stored for use by the scheduler in Per-VC or priority queues 2201 and 2202. In the case of a priority queue, high priority queues 2201; and low priority queues 2201 are maintained and the cells in each priority queue are transmitted on a FIFO basis. A more preferable mode of queuing is to have a queue for each VC, which is designated to have a high or low priority, and then store the cells belonging to each VC in its corresponding queue. Cells in these per-VC queues are also transmitted on a FIFO basis to preserve sequence integrity.

A scheduler 2300 sends Spackets belonging to various priorities or VCs over the satellite link. The scheduler is designed to be fair to VCs within a priority and between priorities as well. If the Spacket is to be compressed then it is sent to the Data Compressor 2400. The scheduler 2300 uses all the priority information for the various VCs and tries to be fair in the scheduling of the Spackets. A simple scheduling algorithm is to process all the high priority per-VC queues on a round-robin basis and then to process all the low priority per-VC queues on a round-robin basis. Another option for the scheduler would be to transmit at least one low priority cell every "n" high priority cells. This could assure some degree of fairness between priorities. A further option would be, within a priority, to use a weighted round-robin scheduling algorithm to transmit cells from per-VC queues, the weights reflecting the bandwidths that the VCs have subscribed for. This scheduling algorithm will attempt to schedule different VCs fairly.

Spackets which belong to a VC which has been specified to be compressed are compressed in data compressor 2400. To achieve loss-less data compression, the compression and decompression histories are reset every n Spackets, where n is a configurable parameter. With the FEC, the link is maintained at a very low BER. If a Spacket does get corrupted, then the resetting of the histories, will ensure that not more than n Spackets are affected.

Figure 8C:
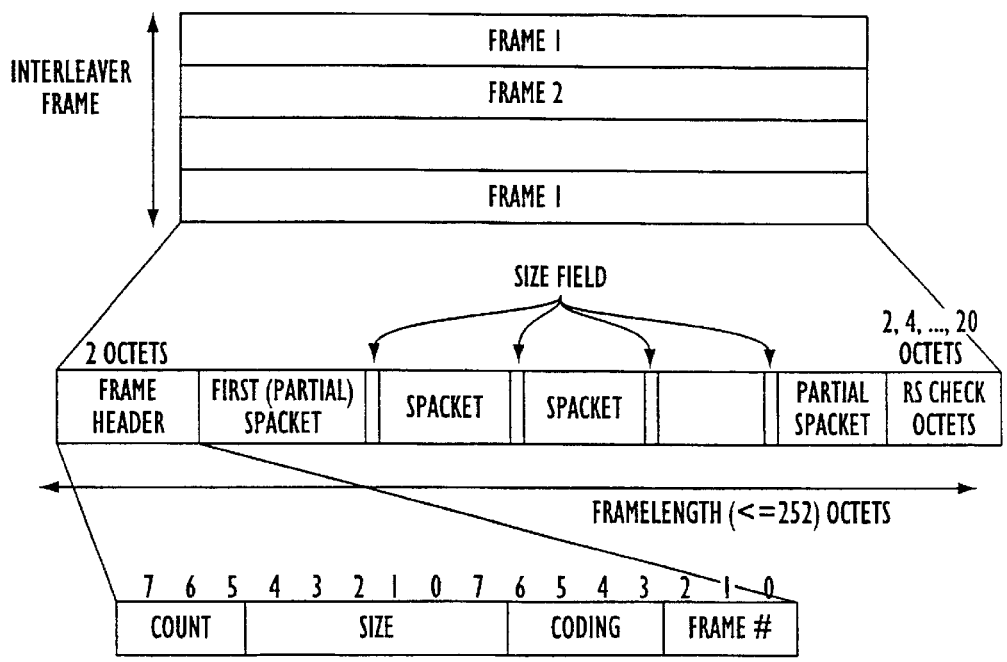
FIG. 8C illustrates a satellite/wireless frame structure that is applicable to a frame relay system.

Finally, the compressed or uncompressed Spackets are provided to a satellite/wireless frame processor 2501, which incorporates the Spackets into a frame for transmission over the satellite/wireless link. This frame structure has been designed to facilitate fast frame synchronization, accommodation of several variable-size packets, fast recovery from lost frames, very low bandwidth overhead, as well as dynamic Reed-Solomon coding change without introducing data loss during the coding rate change transition. FIG. 8C shows the frame format.

The fundamental unit of transmission over the satellite/wireless link is a fixed size frame, which is n octets long. If an interleaving depth of I is used, then I such frames are used to compose an "interleaver frame". The interleaver rearranges the order of the bytes in the interleaver frame and transmits each byte sequentially over the satellite/wireless link. It should be noted that there are no special synchronization bits in this frame structure.

Each frame is n bytes long and consists of:

a 2-octet header followed by the frame payload, and terminated by 2t octets (t>0) of Reed-Solomon coding check bytes in the end.

TABLE 1

| | |
|---|---|
| Count0 | Number of Spackets in frame. Does not include the first Spacket, if any Includes the last Spacket, if any |
| Size0 | Size of first partial Spacket in frame divided by 4. |
| FrameNum | The frame number Each frame is sequentially numbered 0, 1, . . . , 7, 0, . . . |
| Coding | If FrameNum > 3, the coding field represents the number of Reed-Solomon octets / 2 that will be used starting with the next frame numbered 0. Note that 0 is an invalid value for the coding field. If FrameNum == 0, the coding field represents the suggested value of the number of Reed-Solomon octets / 2 that the other side should use for its own transmission. If the coding field value is 0xF, the value implies that the transmitting terminal is not yet synchronized to its receiving bit stream. Note that 0 is an invalid value for the coding field. If FrameNum == 1, the least significant bit of the coding field is 1 if Spacket header compression is activated at the transmitting terminal, 0 otherwise. Other bits of the field are reserved for future use. If FrameNum is 2 or 3, the coding field shall be set to 0's. |

The payload contains a combination of several variable-size packets (the packets may contain compressed or uncompressed Spackets).

The rules for filling a frame payload with Spackets are as follows:

1. If the previously transmitted frame contained a partial Spacket at the end of the payload, the frame payload currently being transmitted begins with the next portion of that Spacket. This portion shall consume min(4 * SIZE, payload_size) octets of the payload, where SIZE 0. The actual size of this partial Spacket may be up to three octets less than 4 * SIZE, in which case the extra octets shall be filled with zeroes.

2. After the initial partial Spacket segment, the payload contains COUNT Spackets where COUNT 0. If the last Spacket cannot be entirely contained in the payload, then only its initial portion is included in the payload. Each Spacket is preceded by a 1-octet-length (in octets) field followed by the Spacket contents. The length field contains the size of the Spacket in bytes.

3. If there are any octets left over in the payload, then the first such unused octet shall contain a zero. The rest of the octets, if any, shall be filled sequentially with the numbers i, i+1, i+2, . . . , where i is the octet number of the first such octet in the payload (octets in the payload are implicitly numbered 0, 1, . . . ).

From these rules, one can see that a frame payload may contain several Spackets and that the Spackets can be transmitted over more than one frame. A frame with no Spackets contains the sequence 0, 1, 2, . . . in the payload. A Spacket may be split across more than two frames if required.

This frame structure design allows the possibility of dynamically changing the Reed-Solomon code size by correspondingly changing the payload size but keeping the frame size constant. If the receiver "loses" a frame, for example, due to excessive bit errors in the frame, the size0 field allows rapid determination of the Spacket boundary on the very next frame. The frame header, shown in FIG. 8C, has four fields which are described in Table 1, wherein the Reed-Solomon check-bytes are the check-bytes generated by a standard Reed-Solomon algorithm with frame size=N bytes and number of check bytes=2t.

During the time that the system has not achieved receive synchronization, it sets the Reed-Solomon code value of its receiver and its transmitter to the maximum value. After the system achieves receive synchronization and it detects that the remote terminal has also achieved receive synchronization (i.e., the coding field in the received frame header of frame number 0 contains a valid code value), it activates an adaptive coding algorithm.

Transmissions from the satellite/wireless network are received and processed by a Satellite/Wireless frame processor 2502, which performs the inverse operation of that performed by the frame processor 2501, strips the Spackets from the frame format and produces the compressed and un-compressed Spackets.

Next, compressed Spackets are sent to Data Decompression module 2600, which decompresses the Spackets belonging to a VC which has been configured to be compressed. Compression and decompression histories are maintained in the Data compressor 2400 and the decompressor 2600, respectively. These histories are reset once every n Spackets, where n is a configurable parameter. This is done to minimize the effect that a lost or erroneous Spacket has on the following Spackets.

A reassembly and resequencing processor 2700 keeps track of Spackets belonging to all the VCs. The reassembly algorithm works on a per-VC basis. The Spackets for each VC are resequenced based on the sequence and packet numbers. The following rules are used to reassemble frame relay packets:

If a Spacket with a sequence number of zero is received, discard any previous incompletely assembled frame relay packet and start reassembling this new packet.

If a Spacket with the same packet number and VC Id, with a sequence number one more than the previous Spacket is received, then append this Spacket to the partially reassembled frame relay packet. If the "last field" indicates that the Spacket is the last Spacket of a frame relay packet, the frame relay packet has been completely assembled.

If a Spacket with sequence number which is out of sequence, and non-zero, is received, discard this new Spacket and any partially reassembled frame relay packet.

If the packet number of the Spacket received is not the same as that of the previous Spacket and the sequence number of the received Spacket is not zero, discard this new Spacket and any partially reassembled frame relay packet.

Optionally, a length field could be added to the frame relay packet at the transmitting terminal before it is segmented and transmitted over the satellite/wireless link. This length field could be used at the receiving terminal to check if the frame relay packet has been reassembled properly. If it hasn't then the frame relay packet is added to the transmit queue.

A transmit queue 2800 contains frame relay packets received from the remote terminal which will be transmitted over the terrestrial link. These packets are processed by the frame relay physical and data link layer processing module and transmitted over the terrestrial link.

Finally, the frame relay physical and data link layer processing module 2000 will reassemble the Spackets in to the appropriate frame relay configuration for transmission over the private or public network.

In order to save bandwidth, an acquisition and synchronization technique, similar to that used for ATM transmissions as described previously, may be used to compress the VC Id of a frame relay packet into a smaller value. This technique utilizes the fact that the number of VCs carried over the satellite/wireless link is not very large and can be compressed to a much smaller VC Id space. If header compression has been enabled in the system, then the VCs are mapped into a new value as specified by the size of the compressed VC field. This header compression information is periodically exchanged between the communicating terminals. Also, every time a new mapping is created, this information is asynchronously exchanged between the terminals before the actual transfer of the mapped packet begins.

Finally, given the foregoing operation of the frame relay system, when applied to transmissions in a point-to-multipoint time division system, such as TDMA or TDM, the use of time stamps and frame counts, as explained with respect to ATM transmissions in the first preferred embodiment, could be applied. In particular, with reference to FIG. 7, a similar TDMA/Frame Relay interface would exist between the Frame Relay network and the satellite transmission network. A Frame Relay hardware driver would append to each Spacket a time count and frame count from a time counter and frame counter, comparable to counters 701 and 702 in FIG. 7. The modified Spackets would be subject to conventional Frame Relay processing in the interface, including data compression, priority management, traffic policing and the like. The modified Spackets would be provided to a TDMA frame packing unit, comparable to unit 730 in FIG. 7. A frame unpacking unit comprarable to unit 760 in FIG. 7 would receive the multiple TDMA bursts and a sorter unit comparable to unit 770 would separate and order the Spackets on the basis of the time and frame counter values appended to the Spackets that are received. All of the terminals would have their counters synchronized using conventional techniques. Thus, based on this rearrangement of Spackets, Frame Relay packets can be reassembled and driven onto a terrestrial networks with minimal 2-point Cell Delay Variation by a hardware driver. A modem can be used to provide the Frame Relay modules with the TFT and RFT signals for coordination.

Although certain preferred embodiments of the present invention have been described, the spirit and scope of the invention is not restricted to that which is described above and it is the claims which are relied upon to define the present invention in accordance with applicable principles of law.

We claim:

1. A communication system for transmitting cell/packet-based signals comprising: a time division-based point-to-multipoint network and at least two local area networks that are communicatively connected by said time division-based point-to-multipoint network, each of said local area networks comprising:

(a) a switch for providing information formatted within cell/packets, (b) an interface for connecting to said switch, said interface comprising a time stamp processing unit and a frame counter unit;

(c) first means for combining an output from said time stamp processing unit and an output from said frame count unit with a cell/packet to form a time marked cell/packet, respectively;

(d) second means for assembling a plurality of said time marked cell/packets into a time division frame;

(e) a modem for connecting said time division frame to a transmitter for transmitting time division bursts;

(f) a modem for receiving time division bursts and detecting a time division frame;

(g) third means for disassembling a plurality of time marked cells or packets in said detected time division frame; and (h) fourth means for detecting cell/packets on the basis of said respective time marked cell/packets.

2. The communication system as set forth in claim 1 wherein said time marked cell/packets comprise at least a frame count uniquely identifying the relative time of occurrence of a frame containing a cell/packet.

3. The communication system as set forth in claim 1 wherein a cell/packet comprises an ATM cell.

4. The communication system as set forth in claim 1 wherein a cell/packet comprises one of a frame relay packet or Internet packet.

5. The communication system as set forth in claim 1 wherein said time stamp processing unit comprises a time counter.

6. The communication system of claim 5 wherein said time counter is resetable on the basis of transmit frame times and said frame counter is incremented by 1 every transmit frame time.

7. The communication system of claim 5 wherein said time counter is a n-bit shift register operative to count from 0 to $2^n-1$ in each frame period.

8. The communication system of claim 1 wherein each transmitted cell/packet is associated with a value in the time counter processing unit and a value in the frame counter unit when said cell/packet is received by said local area network from an external terrestrial transmission network.

9. The communication system of claim 1 wherein said time stamp processing unit comprises a first and second counter, said first counter being operative to control generation of a time stamp and being resetable each transmit frame time, and a second counter for counting, said second counter being resetable on the basis of a receive frame time.

10. The communication system as set forth in claim 1 wherein said frame counter unit further comprises a first and a second frame counter, said first counter being operative to count by 1 every transmit frame time and said second counter being operative to count by 1 every receive frame time.

11. The communication system as set forth in claim 9 wherein a cell/packet that has been received from said first local area network, will be output only when the value of a counter in said time stamp unit is equal to or greater than a time stamp value of a received cell/packet, and the value of a counter in said frame count unit and the frame count of the cell/packet at the receiving terminal match.

12. The communication system as set forth in claim 1 wherein said time division system comprises a TDMA system.

13. The communication system as set forth in claim 1 wherein said time division system comprises a TDM system.

14. The communication system as set forth in claim 1 further comprising means for compressing data prior to packing in a time division frame.

15. A local area network for connection between a terrestrial cell- or packet-based network and a time division-based point-to-multipoint network, said local area network comprising:

(a) a switch for providing information formatted within cells or packets, (b) an interface for connecting to said switch, said interface comprising a time stamp processing unit and a frame counter unit;

(c) first means for combining an output from said time stamp processing unit and an output from said frame count unit with a cell or packet to form a time marked cell or packet, respectively;

(d) second means for assembling a plurality of said time marked cells or packets into a time division frame;

(e) a modem for connecting said time division frame to a transmitter for transmitting time division bursts onto said time division network.

16. The local area network as set forth in claim 15, further comprising:

(f) a modem for receiving time division bursts and detecting a time division frame;

(g) third means for disassembling a plurality of time marked cells or packets in said detected time division frame; and (h) fourth means for detecting cells or packets on the basis of said respective time marked cells or packets.

17. The local area network as set forth in claim 15 wherein said time marked cells or packets comprise at least a frame count uniquely identifying the relative time of occurrence of a frame containing a cell or packet.

18. The local area network as set forth in claim 15 wherein said time stamp unit comprises a first counter that is resetable on the basis of transmit frame times and said frame count unit comprises a second counter that is incremented by 1 every transmit frame time.

19. The local area network of claim 18 wherein said first counter is a n-bit shift register operative to count from 0 to $2^n-1$ in each transmit frame period.

20. The local area network as set forth in claim 15 wherein said first means further comprises means for associating each transmitted cell or packet with a value in the time stamp processing unit and a value in the frame counter unit when said cell or packet is received by said local area network from an external terrestrial transmission network.

21. The local area network of claim 16 wherein:

said time stamp processing unit comprises a first and second counter, said first counter being operative to control generation of a time stamp and being resetable each transmit frame time, and a second counter for counting, said second counter being resetable on the basis of a receive frame time; and said frame counter unit further comprises a third and a fourth frame counter, said third counter being operative to count by 1 every transmit frame time and said fourth counter being operative to count by 1 every receive frame time.

22. The local area network of claim 15 wherein said second means for assembling a plurality of said time marked cells or packets into a time division frame comprises one of a TDMA and TDM frame packing unit.

23. A method of transmitting information by cell- or packet-based formats via a satellite/wireless network using a time division protocol comprising:

(a) separating the information into cells or packets, (b) adding a time stamp and a frame count to each said cell or packet to form a time marked cell or packet, respectively;

(c) assembling a plurality of said time marked cells or packets into a time division frame; and (d) transmitting said time division frame as time division bursts.

24. The method of transmitting information by cell- or packet-based formats as set forth in claim 23 further comprising:

(f) receiving time division bursts and detecting a time division frame;

(g) disassembling a plurality of time marked cells or packets in said detected time division frame; and (h) detecting cells or packets on the basis of said respective time marked cells or packets.

25. The method of transmitting information by cell- or packet-based formats as set forth in claim 24 wherein said time marked cells or packets comprise at least a frame count uniquely identifying the relative time of occurrence of a frame containing a cell or packet.

26. The method of transmitting information by cell- or packet-based formats as set forth in claim) wherein a cell comprises an ATM cell and a packet comprises one of a frame relay packet or an Internet packet.

27. The method of transmitting information by cell- or packet-based formats as set forth in claims wherein said time stamp is based upon a count that is resetable on the basis of transmit frame times and said frame count is incremented by 1 every transmit frame time.

28. The method of transmitting information by cell- or packet-based formats as set forth in claim wherein said detecting step comprises:

outputting a received cell or packet only when a value of a time stamp count is equal to or greater than a time stamp value of the received cell or packet, and a frame count value and a frame count of the received cell or packet match.

29. The method of transmitting information by cell- or packet-based formats as set forth in claim 24 further comprising sorting received signals from a plurality of locations on the basis of time stamp and frame count values.

30. The method of transmitting information by cell- or packet-based formats as set forth in claims further comprising transmitting cells or packets on a terrestrial network on the basis of said sorting step.

31. A method of transmitting information by cell- or packet-based formats via a satellite/wireless network using a time division protocol comprising:

(a) separating the information into cells or packets, (b) adding a time stamp and a frame count to each said cell or packet to form a time marked cell or packet, respectively;

(c) assembling a plurality of said time marked cells or packets into a time division frame; and (d) transmitting said time division frame as time division bursts: and further comprising transmitting said detected cells or packets on the basis of a determination of whether a detected cell or packet is a first type or a second type of cell or packet, said first type being one for which 2-point CDV minimization is implemented and said second type being one for which 2-point CDV minimization is not implemented.

32. The method of transmitting information by cell- or packet-based formats as set forth in claim, further comprising associating each transmitted first type cell or packet with a time count value and a frame count value when said cell or packet is received from an external terrestrial network for transmission via said time division protocol on said satellite/wireless network.

* * * * *